(12) United States Patent
Tong et al.

(10) Patent No.: US 9,781,529 B2
(45) Date of Patent: Oct. 3, 2017

(54) ELECTRONIC APPARATUS AND METHOD FOR ACTIVATING SPECIFIED FUNCTION THEREOF

(71) Applicant: HTC Corporation, Taoyuan County (TW)

(72) Inventors: Hann-Shi Tong, Taoyuan County (TW); Chih-Chiang Cheng, Taoyuan County (TW); Yu-Sheng Lee, Taoyuan County (TW); Lei Chen, Taoyuan County (TW); Chun-Min Lee, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 111 days.

(21) Appl. No.: 14/326,478

(22) Filed: Jul. 9, 2014

(65) Prior Publication Data
US 2014/0348336 A1   Nov. 27, 2014

Related U.S. Application Data

(63) Continuation-in-part of application No. 13/752,375, filed on Jan. 28, 2013, now Pat. No. 9,173,020.
(Continued)

(51) Int. Cl.
*H04R 29/00*      (2006.01)
*H04R 3/02*       (2006.01)
(Continued)

(52) U.S. Cl.
CPC ........... *H04R 29/001* (2013.01); *H03G 7/002* (2013.01); *H03G 7/007* (2013.01); *H04R 3/007* (2013.01); *H04R 3/02* (2013.01)

(58) Field of Classification Search
CPC ........ H04R 29/001; H04R 3/007; H04R 3/02; H03G 7/002; H03G 7/007
See application file for complete search history.

(56) References Cited

U.S. PATENT DOCUMENTS

| 5,331,291 A | 7/1994 | D'Agostino, et al. |
| 6,931,135 B1 | 8/2005 | Kohut |

(Continued)

FOREIGN PATENT DOCUMENTS

| EP | 2369852 | 9/2011 |
| EP | 2405675 | 1/2012 |

(Continued)

OTHER PUBLICATIONS

"Office Action of U.S. Parent Application, U.S. Appl. No. 13/752,375" issued on Mar. 6, 2015, p. 1-p. 17.
(Continued)

*Primary Examiner* — Andrew L Sniezek
(74) *Attorney, Agent, or Firm* — Jianq Chyun IP Office

(57) ABSTRACT

An electronic apparatus and a method for activating a specified function are provided. The electronic apparatus includes a speaker, an audio signal processor and an application processor. The audio signal processor senses a variation of an acoustic condition of the speaker. The application processor is used for: generating a logic high or low signal in response to the sensed variation of the acoustic condition; interpreting the logic high or low signal as a control signal; and performing an instruction corresponding to the control signal.

22 Claims, 6 Drawing Sheets

Related U.S. Application Data

(60) Provisional application No. 61/615,904, filed on Mar. 27, 2012.

(51) Int. Cl.
    *H03G 7/00*     (2006.01)
    *H04R 3/00*     (2006.01)

(56) References Cited

U.S. PATENT DOCUMENTS

| | | | |
|---|---|---|---|
| 2003/0072462 A1 | 4/2003 | Hlibowicki | |
| 2006/0126857 A1 | 6/2006 | Pavlov et al. | |
| 2007/0223736 A1* | 9/2007 | Stenmark | H03G 5/005 |
| | | | 381/103 |
| 2011/0116643 A1 | 5/2011 | Tiscareno et al. | |
| 2014/0233744 A1* | 8/2014 | Risberg | H03G 9/005 |
| | | | 381/61 |

FOREIGN PATENT DOCUMENTS

| | | |
|---|---|---|
| EP | 2538699 | 12/2012 |
| EP | 2645740 | 10/2013 |
| TW | 201215177 | 4/2012 |
| TW | 201218785 | 5/2012 |
| TW | 201338567 | 9/2013 |
| TW | 201340732 | 10/2013 |
| WO | 2011079875 | 7/2011 |

OTHER PUBLICATIONS

"Office Action of European Counterpart Application", issued on Nov. 4, 2013, p. 1-p. 7.

"Office Action of European Counterpart Application", issued on Aug. 12, 2013, p. 1-p. 3.

"Office Action of European Counterpart Application," issued on Nov. 18, 2015, p. 1-p. 10.

\* cited by examiner

ELECTRONIC APPARATUS AND METHOD FOR ACTIVATING SPECIFIED FUNCTION THEREOF

CROSS-REFERENCE TO RELATED APPLICATION

This application is a continuation-in-part application of and claims the priority benefit of a prior application Ser. No. 13/752,375, filed on Jan. 28, 2013, now pending. The prior application Ser. No. 13/752,375 claims the priority benefit of U.S. provisional application Ser. No. 61/615,904, filed on Mar. 27, 2012. The entirety of each of the above-mentioned patent applications is hereby incorporated by reference herein and made a part of this specification.

BACKGROUND

Field of the Invention

The invention relates to a specified function activating method for an electronic apparatus. Particularly, the invention relates to a specified function activating method by detecting an acoustic impedance of at least one speaker.

Description of Related Art

At nowadays, portable electronic apparatuses are widely used. For providing a convenience operation interface, touch panel is the most popular structure. By using touch sensors in the touch panel, the sensing area would be restricted by the touch panel. Such as that, the virtual key would occupy the area of the display area. That is, in conventional art, the size and cost of the portable electronic apparatus would be increased for increasing touch sensing areas.

SUMMARY OF THE INVENTION

The invention is directed to an electronic apparatus and a method for activating specified function thereof, which can improve the convenience of the electronic apparatus.

The invention provides an electronic apparatus. The electronic apparatus includes a speaker, an audio signal processor and an application processor. The audio signal processor is coupled to the speaker and used for sensing a variation of an acoustic condition of the speaker. The application processor is coupled to the audio signal processor and used for: generating a logic high or low signal in response to the sensed variation of the acoustic condition; interpreting the logic high or low signal as a control signal; and performing an instruction corresponding to the control signal.

The invention provides a method for activating a specified function. The steps of the method include: sensing a variation of an acoustic condition of a speaker; generating a logic high or low signal in response to the sensed variation of the acoustic condition; interpreting the logic high or low signal as a control signal; and performing an instruction corresponding to the control signal.

According to the above descriptions, in the invention, the specified function can be activated by detecting the acoustic condition of one or more speaker. That is, a user of the electronic apparatus may generate a logic high or low signal by covering at least one speaker opening of corresponding speaker. Moreover, at least one application program may be activated by the logic high or low signal. In this invention, the touch area may be extended by the region of the speaker openings. The convenience of the electronic apparatus is improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
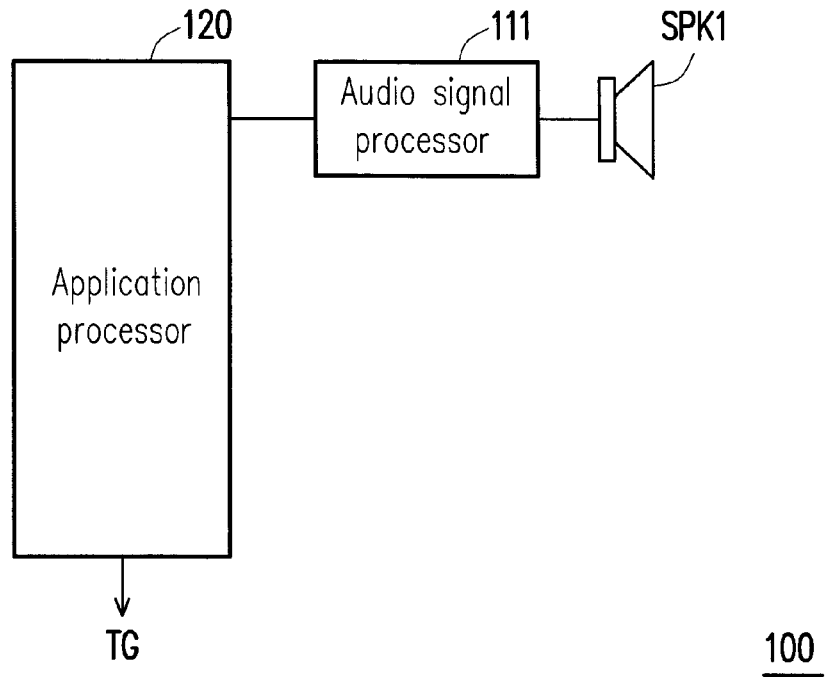
FIG. 1A is a schematic diagram of an electronic apparatus according to an embodiment of present application.

Referring to FIG. 1A, FIG. 1A is a schematic diagram of an electronic apparatus according to an embodiment of present application. The electronic apparatus 100 includes a speaker SPK, an audio signal processor 111, and an application processor 120. The speaker SPK is corresponding to the audio signal processor 111, and the speaker SPK is coupled to the audio signal processor 111. The application processor 120 is coupled to the audio signal processor 111.

The audio signal processor 111 is used to sense a variation of an acoustic condition of the speaker SPK. In other word, the audio signal processor 111 may be used to sense an acoustic impedance of the speakers SPK, and generates sensing signal accordingly. In detail, for example, the audio signal processor 111 may send a detection signal to drive the speaker SPK when an acoustic impedance sensing operation is executed. Furthermore, the speaker SPK has a speaker opening, and when the speaker opening of the speaker SPK is obstructed, the acoustic impedance of the speaker SPK is varied accordingly. The corresponding audio signal processor 111 may sense a variation of the acoustic impedance to obtain the variation of the acoustic condition by sensing the impedance of the speaker SPK.

Figure 1B:
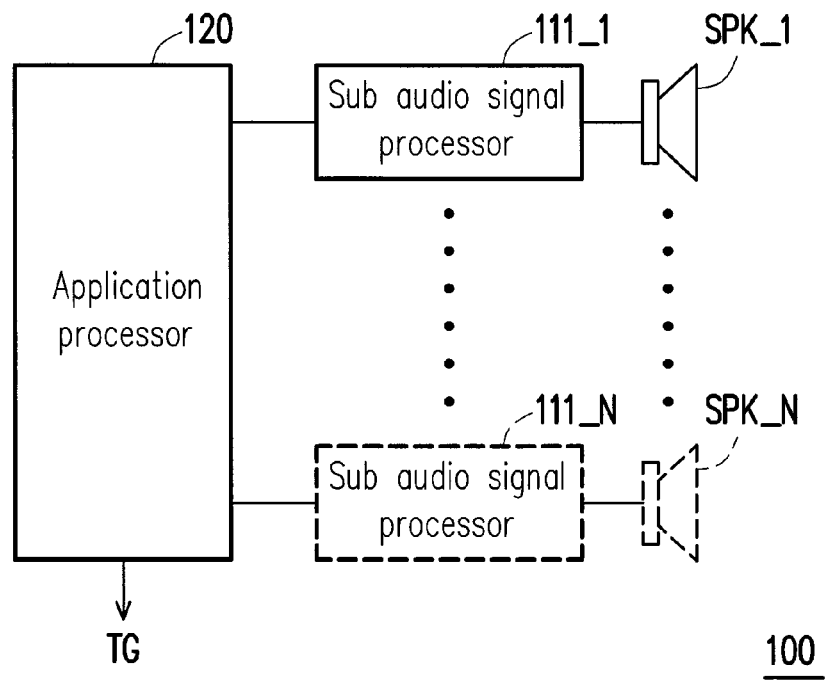
FIG. 1B is another schematic diagram of an electronic apparatus according to an embodiment of present application.

Referring to FIG. 1B, FIG. 1B is another schematic diagram of an electronic apparatus according to an embodiment of present application. The electronic apparatus 100 may include more sub speakers (such as the sub speakers SPK_1-SPK_N), and more sub audio signal processors (such as the audio signal processors 111_1-111_N). The N sub audio signal processors 111_1-111_N respectively sense the variation of the acoustic condition (variations the impedances) of the N sub speakers SPK_1-SPK_N and generate N sub sensing signals according to the variation of the acoustic conditions of N sub speakers SPK_1-SPK_N.

Figure 2A:
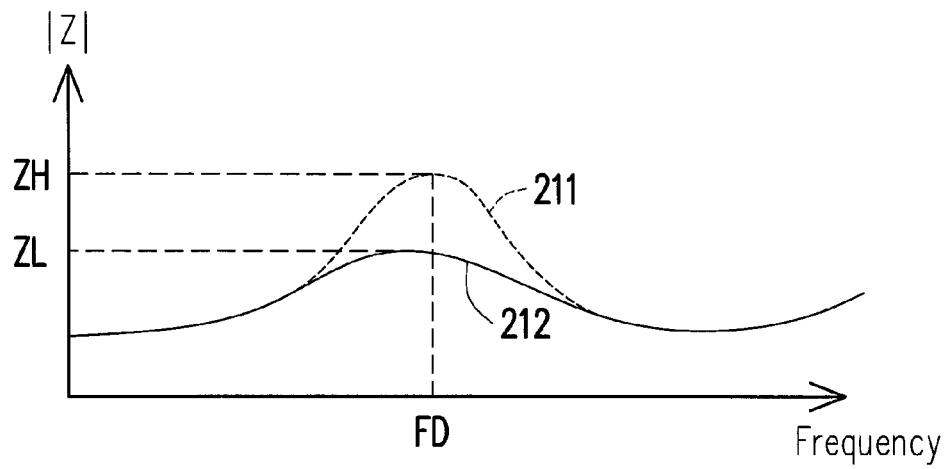
FIG. 2A is a waveform of the impedance curve of the speaker.

Referring to FIG. 2A, FIG. 2A is a waveform of the impedance curve of the speaker. In FIG. 2A, the vertical axis shows impedance of the speaker, and the horizontal axis shows the frequency of the detection signal. A curve 211 shows the impedance of the speaker SPK when the speaker opening of the speaker SPK is not obstructed, and a curve 212 shows the impedance of the speaker SPK when the speaker opening of the speaker SPK is obstructed. It can be seen from FIG. 2A, when the speaker opening of the speaker SPK is obstructed, the impedance of the speaker SPK may be reduced during a frequency region. For example, by sending a detection signal with frequency FD, the impedance of the speaker is reduced from the impedance ZH (by curve 211) to the impedance ZL (by curve 212) when the speaker opening of the speaker SPK is obstructed. That is, the audio signal processor 111 may sense the acoustic condition of the corresponding speaker SPK by sensing the impedance of the corresponding speaker SPK.

Figure 2B:
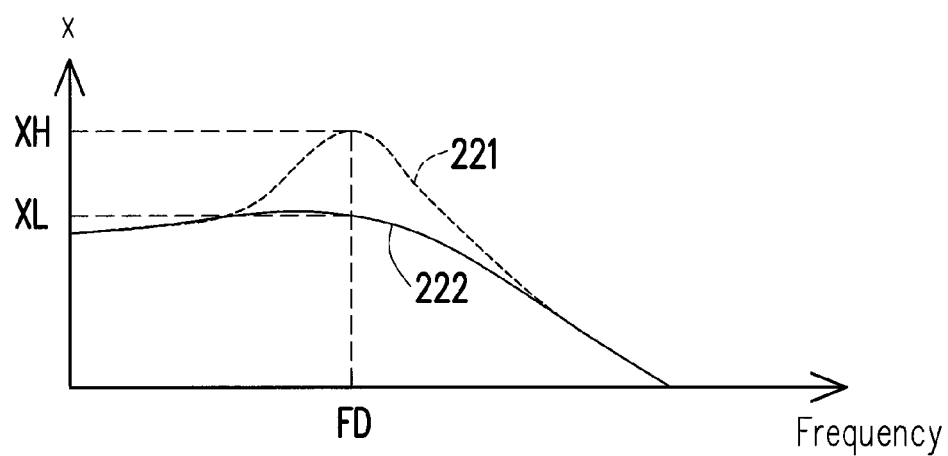
FIG. 2B is a waveform of the excursion curve of the speaker.

On the other hand, the audio signal processor 111 may sense the acoustic condition of the speaker SPK by sensing an excursion the corresponding speaker SPK. Referring to FIG. 2B, FIG. 2B is a waveform of the excursion curve of the speaker. FIG. 2B, the vertical axis shows excursion of the speaker, and the horizontal axis shows the frequency of the detection signal. A curve 221 shows the excursion of the speaker SPK when the speaker opening of the speaker SPK is not obstructed, and a curve 222 shows the excursion of the speaker SPK when the speaker opening of the speaker SPK is obstructed. It can be seen from FIG. 2B, when the speaker opening of the speaker SPK is obstructed, the excursion of the speaker SPK may be reduced during a frequency region. For example, by sending a detection signal with frequency FD, the impedance of the speaker is reduced from the excursion XH (by curve 221) to the excursion XL (by curve 222) when the speaker opening of the speaker SPK is obstructed. That is, the audio signal processor 111 may sense the acoustic impedance of the corresponding speaker SPK by sensing the excursion of the corresponding speaker SPK.

That is, the variation of the acoustic condition of the speaker SPK can be obtained according to at least one of the impedance and the excursion of the speaker SPK.

Referring to FIG. 1A, the application processor 120 may generates a logic high or low signal TG in response to the sensed variation of the acoustic condition of the speaker SPK. The logic high or low signal TG may be interpreted by the application processor 120 to be a control signal. Further, the application processor 120 may perform an instruction corresponding to the control signal.

In an embodiment of the invention, the audio signal processor 111 may generate a quality factor of the speaker SPK according to the impedance of the speaker SPK. The impedance of the speaker SPK is decreased when a user obstructs the speaker opening of the speaker SPK, and the impedance of the speaker SPK is increased when a user removes the obstruction to the speaker opening of the speaker SPK. Accordingly, the quality factor of the speaker SPK is varied according to the position of the obstruction related to the speaker opening of the speaker SPK, and the variation of the quality factor may be obtained by the audio signal processor 111.

Also, the audio signal processor 111 may further generate the quality factor of the speaker SPK according to the excursion of the speaker SPK. The excursion of the speaker SPK is decreased when the user obstructs the speaker opening of the speaker SPK, and the excursion of the speaker SPK is increased when a user removes the obstruction to the speaker opening of the speaker SPK.

Of course, the quality factor of the speaker SPK may be obtained according to both of the excursion and impedance of the speaker SPK.

Figure 3:
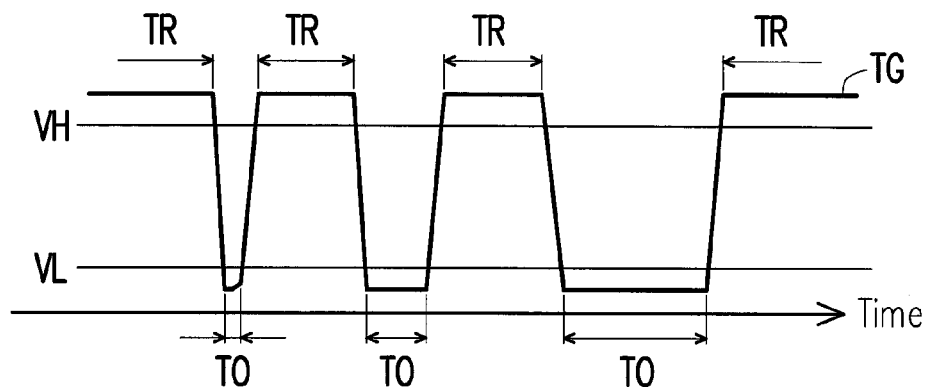
FIG. 3 is a waveform of the logic high or low signal TG according to the embodiment of the present application.

By comparing the quality factor of the speaker SPK with a threshold value, the application processor 120 may generate the logic high or low signal TG. Referring to FIG. 3, FIG. 3 is a waveform of the logic high or low signal TG according to the embodiment of the present application. In FIG. 3, during the time periods TR, a finger of the user is released from the opening of the speaker, and the quality factor of the speaker is increased accordingly, and the logic high or low signal TG is set to a high voltage level VH. On the contrary, during the time periods TD, the finger of the user obstructs the opening of the speaker, and the quality factor of the speaker is decreased accordingly, and the logic high or low signal TG is set to a low voltage level VL. Apparently, the logic high or low signal TG with one or more pulses can be obtained by obstructing and releasing from the opening of the speaker once or continuously by the user.

The pulse width of the logic high or low signal TG can be controlled by user, and when the user obstructs the speaker opening for a long time, the logic high or low signal TG may have a low pulse with longer width.

Of course, the relationship between the voltage level of the logic high or low signal TG and the obstruction status of the speaker is not fixed and may be defined by designer. In another embodiment of present application, the voltage level of the logic high or low signal TG may be set to the lower voltage level VL when the speaker opening is not obstructed, and the voltage level of the logic high or low signal TG may be set to the higher voltage level VH when the speaker opening is obstructed.

Referring to FIG. 1B again, a plurality of sub audio signal processors 111_1-111_N and sub speakers SPK_1-SPK_N may provide a plurality of sub quality factors to the application processor 120. The application processor 120 may generate a plurality of sub logic high or low signals according to the sub quality factors of the sub speakers SPK_1-SPK_N, respectively. Furthermore, the application processor 120 may generate the logic high or low signal TG according to the sub logic high or low signal. For an example, the application processor 120 may operate a logic operation on the sub logic high or low signals to generate the logic high or low signal TG.

On the other hand, the application processor 120 may provide the logic high or low signal TG to perform an instruction to activate an application program of the electronic apparatus 100. The application processor 120 may compare the logic high or low signal and a defined pattern for determining whether to activate the application program or not. In detail, a plurality of defined patterns may be provided to the application processor 120. The plurality of defined patterns may respectively correspond to a plurality application program or a plurality functions of an application program. When a logic high or low signal TG is obtained by application processor 120, the application processor 120 may compare a waveform of the logic high or low signal TG and the all of the defined patterns. While one of the defined patterns matches the waveform of the logic high or low signal TG, a control signal may be interpreted and the application program corresponding to the matched data pattern is selected for executing corresponding to the control signal. On the contrary, while there are no defined pattern matches the waveform of the logic high or low signal TG, the logic high or low signal TG is an invalid signal, and may be ignored by the electronic apparatus 100.

The defined patterns may be pre-set by designer of the electronic apparatus 100, and the data patterns may stored in a storage device (such as memory) which may be embedded in or coupled to the application processor 120.

Figure 4:
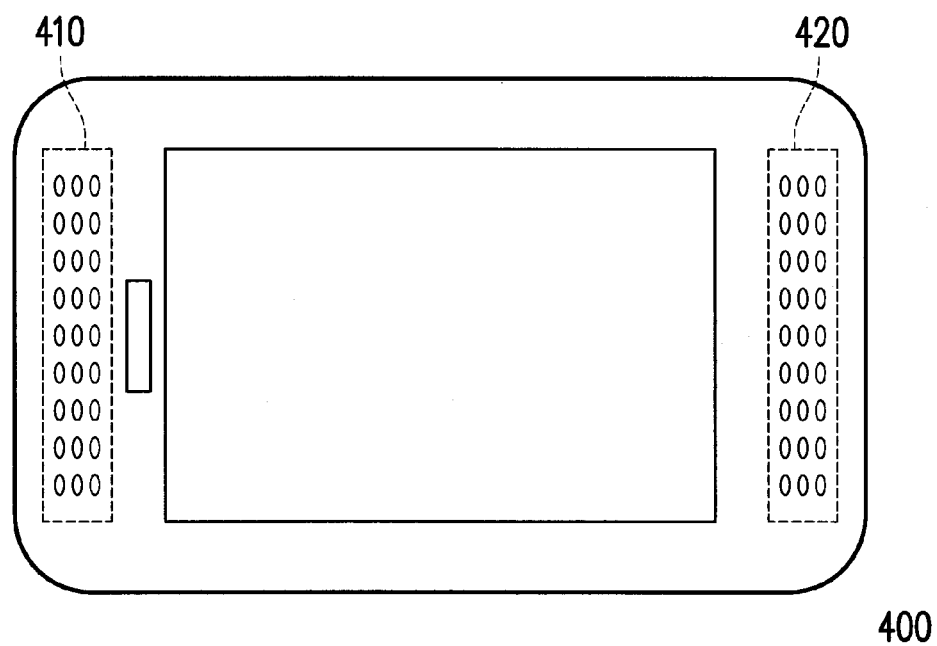
FIG. 4 is an application example of an electronic apparatus according to an embodiment of the present application.

Referring to FIG. 4, FIG. 4 is an application example of an electronic apparatus according to an embodiment of the present application. The electronic apparatus 400 may be a smart phone and have a housing with an aperture. In FIG. 4, two speakers are respectively disposed in opposite sides of the electronic apparatus 400. Two speaker opening 410 and 420 are dispose on a top surface of the electronic apparatus 400, and audio in transport through the speaker openings 410 and 420. The speaker openings 410 and 420 face the aperture of the housing for output audible sounds through the aperture. The speakers of the electronic apparatus 400 are driven by detection signals. When a user want to activate a specified application program, the user can use one or two fingers to cover at least portion of at least one of the speaker openings 410 and 420 once or several times for generating a logic high or low signal. Then, the specified application program may be activated by the logic high or low signal.

For example, when the electronic apparatus 400 receives a phone call, and phone ringing may be broadcasted by the speakers in the electronic apparatus 400. If the user want to stop the phone ringing, user may use one or two fingers to cover at least portion of at least one of the speaker openings 410 and 420 once or several times to generate a logic high or low signal, and the phone ringing may be stop by the logic high or low signal.

Figure 5:
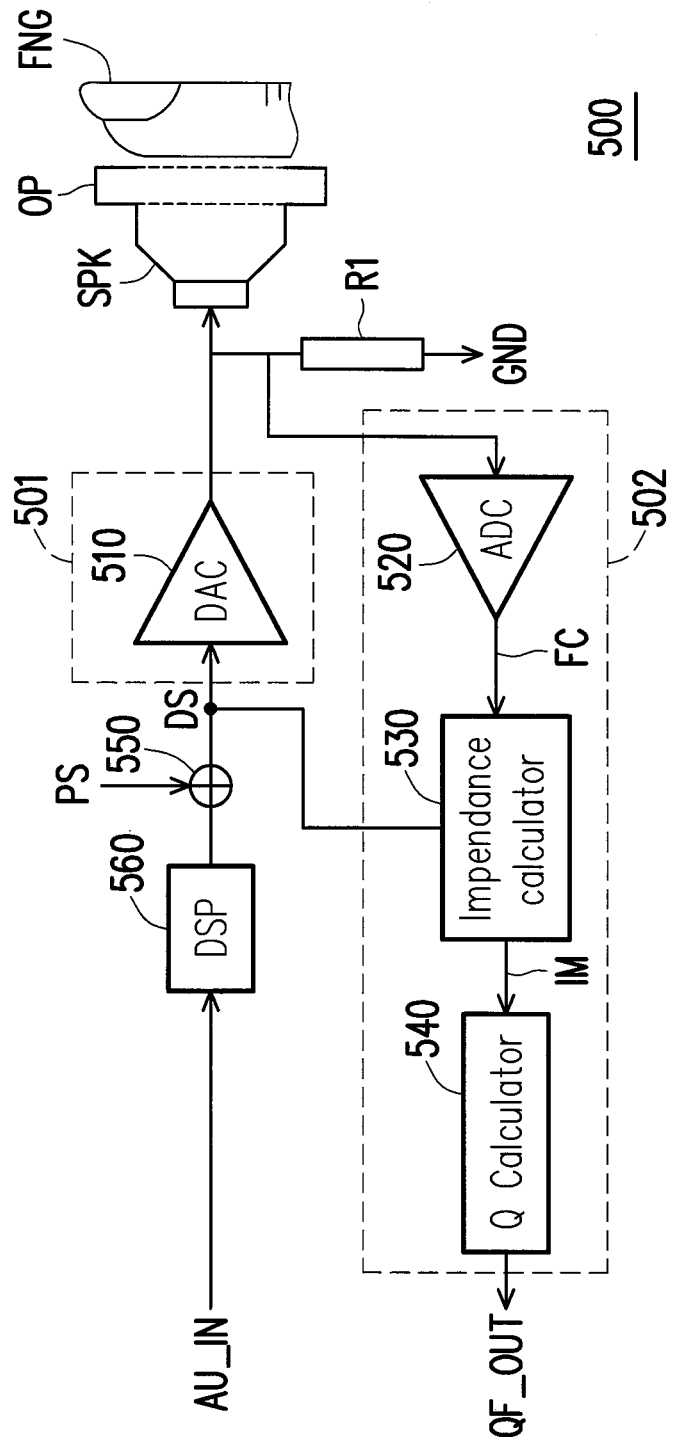
FIG. 5 is a schematic diagram of audio signal processor according to an embodiment of present application.

Referring to FIG. 5, FIG. 5 is a schematic diagram of audio signal processor according to an embodiment of present application. The audio signal processor 500 includes driving circuit 501, an acoustic impedances condition sensor 502, a mixer 550, and a digital signal processor (DSP) 560. The driving circuit 501 includes a digital to analog converter (DAC) 510. The acoustic impedances condition sensor 502 includes an analog to digital converter (ADC) 520, an impedance calculator 530, and a quality factor (Q) calculator 540. An output end of the DAC 510 is coupled to the speaker SPK, and an input end of the DAC 510 is coupled to the mixer 550 for receiving a detection signal DS. The DSP 560 receives a playback audio signal AU_IN from the application processor, and the DSP 560 operates a digital process on the playback audio signal AU_IN to generate a driving signal PAU. The DSP 560 is further coupled to the mixer 550, and provides the driving signal PAU to the mixer 550. The mixer 550 may receive at least one of the driving signal PAU and a pilot signal PS. If both of the driving signal PAU and the pilot signal PS are received by the mixer 550, the mixer 550 mixing the driving signal PAU and the pilot signal PS for generating the detection signal DS. Otherwise, if only one of the driving signal PAU and the pilot signal PS is received by the mixer 550, the mixer 550 passes the received signal to be the detection signal DS. Besides, the pilot signal PS may be provided by the application processor.

Here, the pilot signal PS is a wide band and low volume audio signal, and when only the pilot signal PS is transported to the driving circuit 501, the speaker SPK broadcasts a low volume audio. Besides, a frequency of the pilot signal PS may be between 500-1 KHz, or less than 100 Hz. The driving circuit 501 may includes a digital to analog converter (DAC) 510, and the DAC 510 converts the detection signal DS into a driving voltage for driving the speaker SPK.

The acoustic impedances condition sensor 502 is coupled to the speaker SPK, receiving a current signal and the detection and obtaining the variation of the acoustic condition of the speaker. The ADC 520 is coupled to the speaker SPK, and the ADC 520 receives a driving current signal from the speaker SPK, and the driving current signal may be in analog format. The ADC 520 converts the driving current signal to digital format and generates a feedback current signal FC accordingly. The impedance calculator 530 is coupled to the ADC 520 and receives the feedback current signal FC. The impedance calculator 530 is also coupled to the input of the DAC 510 for receiving the detection signal DS. The detection signal DS is a voltage signal which is transported to the speaker SPK for driving the speaker SPK. That is, the impedance calculator 530 may obtain the impedance IM of the speaker SPK according to the detection signal DS and the feedback current signal FC. In detail, the impedance calculator 530 may obtain the impedance IM of the speaker SPK by dividing the detection signal DS by the feedback current signal FC.

The Q calculator 540 is coupled to the impedance calculator 530 for receiving the impedance IM of the speaker SPK. The Q calculator 540 may calculate a quality factor QF_OUT of the speaker SPK according to the impedance IM.

In detail operation of the audio signal processor 500, when the acoustic impedance sensing operation is operated, the detection signal DS is generated and transported to drive the speaker SPK. The detection signal DS may be the pilot signal PS only, and the pilot signal PS is a low volume audio signal which can not be heard by a user. Besides, the detection signal DS may be the driving signal PAU only, or mixing by the driving signal PAU and the pilot signal PS.

Then, when a finger FNG of the user covers a speaker opening OP of the speaker SPK, the acoustic impedance of the speaker SPK is changed. At this time, the ADC 520 receives the current signal of the speaker SPK and generates the feedback current signal FC by analog-to-digital converting operation. Furthermore, the current signal of the speaker SPK may be obtained by a current sensing resistor R1 which is coupled between the speaker SPK and a reference ground end GND.

The impedance calculator 530 receives the feedback current signal FC and the detection signal DS to respectively obtain a current and a voltage signal on the speaker SPK. That is, the impedance calculator 530 may calculate the impedance IM of the speaker SPK according to the feedback current signal FC and the detection signal DS. Such as that, the Q calculator 540 may generate the quality factor QF_OUT according to the impedance IM.

Please note that, the quality factor QF_OUT may be varied according the variation of the acoustic impedance of the speaker SPK. The logic high or low signal can be generated by the variation of the quality factor QF_OUT. For example, when the quality factor QF_OUT is reduced to lower than a first preset value, the logic high or low signal may be set to logic low, and when the quality factor QF_OUT is raised to higher than a second preset value, the logic high or low signal may be set to logic high. Here, the first preset value may be lower than the second preset value, or the first preset value may be equaled to the second preset value.

It can be realized, the logic high or low signal may be generated by the position relationship of the finger FNG and the speaker opening OP. The user may control the logic level of the logic high or low signal by obstructing or releasing from the speaker opening OP. That is, the logic high or low signal with arbitrarily pulse number and pulse width can be generated.

Figure 6:
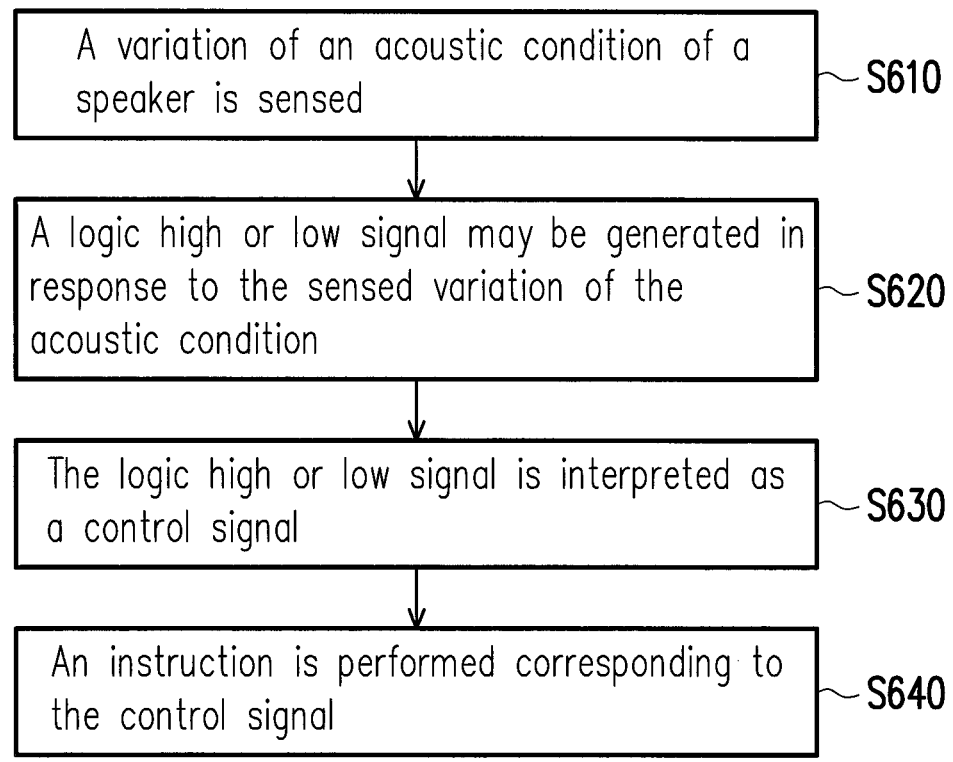
FIG. 6 is a flow chart of a method for activating a specified function according to an embodiment of the present application.

Referring to FIG. 6, FIG. 6 is a flow chart of a method for activating a specified function according to an embodiment of the present application. In step S610, at least one variation of an acoustic condition of at least one speaker is sensed, and in step S620, a logic high or low signal may be generated in response to the sensed variation of the acoustic condition. Further, in step S630, the logic high or low signal and a defined pattern is compared for determining whether the logic high or low signal and the defined pattern are matched or not, and in step S640, at least one application program or at least one function is activated when the logic high or low signal and the defined pattern are matched.

Figure 7:
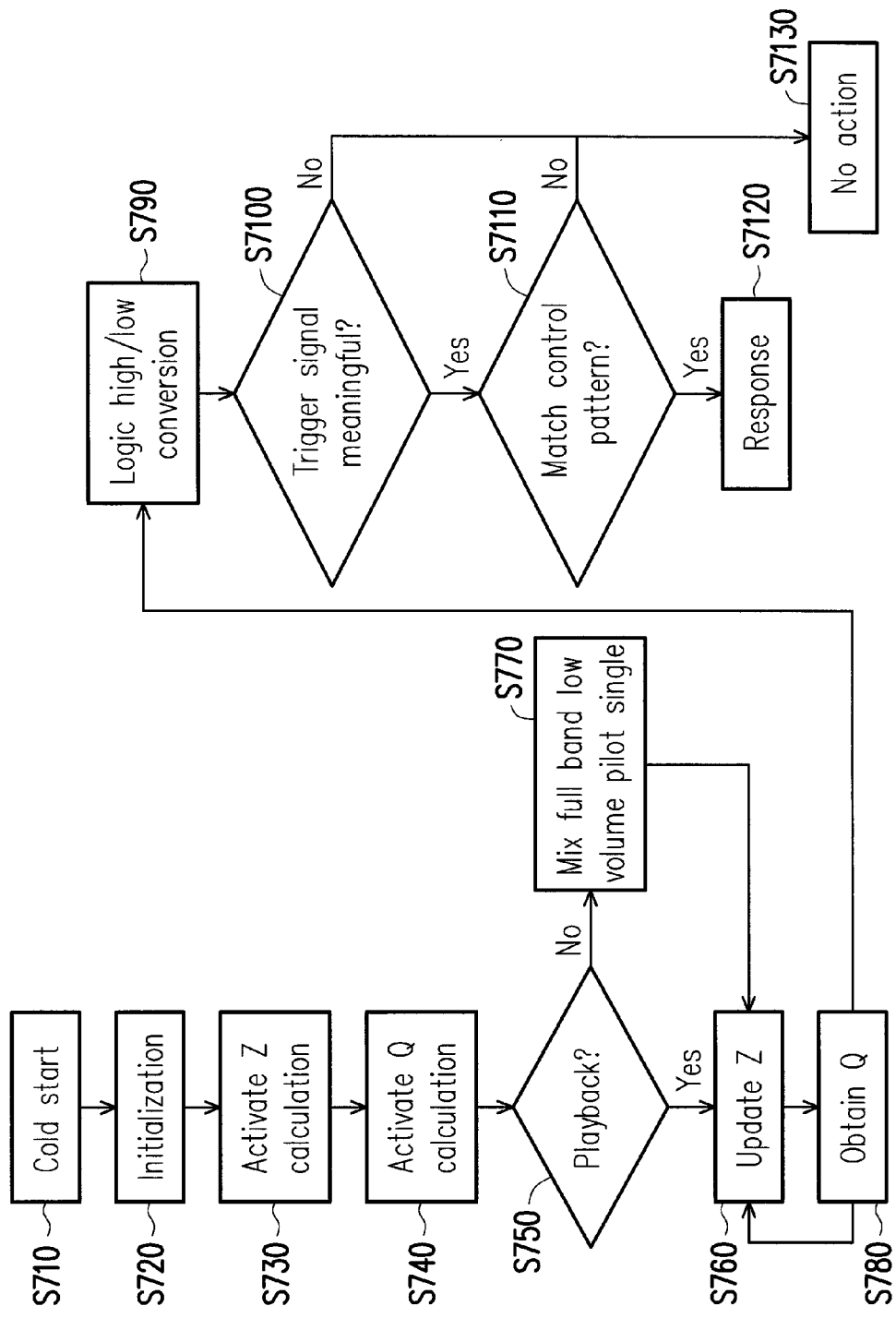
FIG. 7 is another flow chart of the method for activating a specified function according to another embodiment of the present application.

In detail, referring to FIG. 7, FIG. 7 is another flow chart of the method for activating a specified function according to another embodiment of the present application. In steps S710 and S720, an audio broadcasting system of an electronic apparatus is cold started and initialized, respectively. In step S730, one or more audio signal processors are activated for sensing the acoustic impedances of the speakers by calculating the impedances (Z) of the speaks, and in step S740, the audio signal processors are activated to calculate the quality factors (Q) according to the impedances (Z) of the speak. Further, the step S750 checks whether an audio signal playback or not. If a result of step S750 is yes, the impedances of the speaker is keeping on updated by voltage signals and current signals, wherein, each of the voltage signals is used to driving the corresponding speaker, and each of the current signals is a current of corresponding speaker. On the contrary, if the result of step S750 is no, a pilot signal with full band and low volume is generated to keep the impedance calculation correct (step S770).

In step S780, quality factors (Q) of the speakers can be obtained according to the impedances obtained in step S760. By checking the variation of each of the quality factors, a logic high or low conversation operation is executed in step S790, and a logic high or low signal may be generated. The step S7100 checks whether the logic high or low signal is meaningful or not. If the check result of step S7100 is yes, the logic high or low signal may be compared with a defined pattern. If the logic high or low signal matches with the defined pattern, a function corresponding to the defined pattern responds accordingly in step S7120. Besides, if at least one the check results of steps S7100 and S7110 are no, no action is operated in the electronic apparatus (step S7130).

Please note here, a plurality of defined patterns may be pre-set, and the defined patterns may respectively correspond to a plurality functions. When the logic high or low signal matches with one of the defined patterns, the function corresponding to the matched defined pattern is executed. Besides, the specified functions may be executed by one or more application programs or circuits in the electronic apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic apparatus, comprising:
a speaker;
an audio signal processor, coupled to the speaker, for sensing a variation of an acoustic condition of the speaker in response to a pilot signal; and
an application processor, coupled to the audio signal processor, for:
generating a logic high or low signal in response to the sensed variation of the acoustic condition;
interpreting the logic high or low signal as a control signal;
performing an instruction corresponding to the control signal; and
generating the pilot signal and driving the speaker according to the pilot signal.

2. The electronic apparatus as claimed in claim 1, wherein the application processor is used for:
comparing the logic high or low signal and a defined pattern for determining whether the logic high or low signal and the defined pattern are matched or not;
interpreting the logic high or low signal as the control signal when the logic high or low signal and the defined pattern are matched; and
activating at least one application program or at least one function in response to the instruction.

3. The electronic apparatus as claimed in claim 2, wherein the audio signal processor further generates a quality factor according to at least one of the excursion and the impedance based on the acoustic condition.

4. The electronic apparatus as claimed in claim 3, wherein the audio signal processor comprises N sub audio signal processors, and the speaker comprises N sub speakers; wherein the N sub audio signal processors respectively senses the variation of the acoustic condition of the N sub speakers and generate N sub quality factors according to the variation of the acoustic conditions of N sub speakers and the application processor generates N sub logic high or low signals according to the N sub quality factors and interpreting the N sub logic high or low signals as the control signal; wherein, N is a positive integer larger than 1.

5. The electronic apparatus as claimed in claim 1, wherein, the application processor is for converting the quality factor to the logic high or low signal based on whether the quality factor is less than a threshold value.

6. The electronic apparatus as claimed in claim 1, further comprising a housing with an aperture, wherein the speaker comprises an opening facing the aperture of the housing for output audible sounds through the aperture, the audio signal processor is for sensing at least one of an impedance resonance curve and an excursion resonance curve of the speaker and for calculating the quality factor according to at least one of the impedance and the excursion of the speaker based on at least one of the impedance resonance curve and the excursion resonance curve when the speaker output audible sound through the aperture.

7. The electronic apparatus as claimed in claim 1, wherein the audio signal processor is used for:
determining whether the application processor is providing a playback audio signal;
generating the pilot signal when determines that the application processor is not providing the playback audio signal;
converting the pilot signal to a driving voltage to drive the speaker; and
sensing the variation of the acoustic condition of the speaker in response to the driving voltage;

wherein the pilot signal is a full band signal with a volume smaller than an audible value, and wherein the pilot signal is generated as a driving signal.

8. The electronic apparatus as claimed in claim 1, wherein the application processor provides a playback audio signal and a pilot signal, and the audio signal processor mixes the playback audio signal and the pilot signal to generate a driving signal, the audio signal processor converts the driving signal into a driving voltage and drives the speaker according to the driving voltage;
wherein the pilot signal is a full band signal with a volume smaller than an audible value.

9. The electronic apparatus as claimed in claim 1, wherein the application processor provides a playback audio signal, and the playback audio signal is a wide band signal with a volume lower than an audible value, the audio signal processor receives the playback audio signal to be a detection signal and drives the speaker according to the detection signal.

10. The electronic apparatus as claimed in claim 1, wherein the audio signal processor comprises:
a digital signal processor, for providing a driving signal;
a driving circuit, coupled between the digital signal processor and the speaker, for converting the driving signal into a driving voltage and for driving the speaker based on the driving voltage;
an acoustic impedances condition sensor, coupled to the speaker and the digital signal processor, for receiving a driving current from the speaker and the driving signal from the digital signal processor and for sensing the variation of the acoustic condition of the speaker based on the driving signal and the driving current.

11. The electronic apparatus as claimed in claim 10, wherein the acoustic impedances condition sensor comprises:
an analog to digital converter, coupled to the speaker, for receiving the driving current in analog format from the speaker and converting the driving current into a feedback current signal in digital format; and
an impedance calculator, coupled to the analog to digital converter and the digital signal processor, for calculating an impedance of the speaker according to the feedback current signal and the driving signal.

12. The electronic apparatus as claimed in claim 11, wherein each of the acoustic impedances condition sensor further comprises:
a quality factor calculator, coupled to the impedance calculator, for generating the quality factor according to at least one of the excursion and the impedance based on the acoustic condition.

13. The electronic apparatus as claimed in claim 10, wherein the driving circuit is a digital to analog converter.

14. The electronic apparatus as claimed in claim 13, wherein the digital signal processor further comprises:
a mixer, coupled to the digital to analog converter, mixing a pilot signal and an audio signal to generate a mixed signal as the driving signal.

15. A method for activating a specified function, comprising:
generating a pilot signal and driving a speaker according to the pilot signal;
sensing a variation of an acoustic condition of the speaker in response to the pilot signal;
generating a logic high or low signal in response to the sensed variation of the acoustic condition;
interpreting the logic high or low signal as a control signal; and
performing an instruction corresponding to the control signal.

16. The method as claimed in claim 15, wherein the step of interpreting the logic high or low signal as the control signal and performing the instruction corresponding to the control signal comprises:
comparing the logic high or low signal and a defined pattern for determining whether the logic high or low signal and the defined pattern are matched or not;
interpreting the logic high or low signal as the control signal when the logic high or low signal and the defined pattern are matched; and
activating at least one application program or at least one function in response to the instruction.

17. The method as claimed in claim 15, wherein the step of generating the logic high or low signal in response to the sensed variation of the acoustic condition comprises:
generates a quality factor according to at least one of the excursion and the impedance based on the acoustic condition; and
generating the logic high or low signal according to the quality factor.

18. The method as claimed in claim 17, wherein the step of generating the logic high or low signal according to the quality factor comprises:
converting the quality factor to the logic high or low signal based on whether the quality factor is less than a threshold value.

19. The method as claimed in claim 15, wherein if the number of the speaker is N and the number of the audio signal processor is N, the step of the method comprises:
respectively sensing the variation of the acoustic condition of the N speakers;
generating N sub quality factors according to the variation of the acoustic conditions of N speakers;
generating N sub logic high or low signals according to the N sub quality factors; and
interpreting the N sub logic high or low signals as the control signal,
wherein, N is a positive integer larger than 1.

20. The method as claimed in claim 15, wherein, further comprising:
determining whether the application processor is providing a playback audio signal;
generating the pilot signal when determines that the application processor is not providing the playback audio signal;
converting the pilot signal to a driving voltage to drive the speaker; and
sensing the variation of the acoustic condition of the speaker in response to the driving voltage,
wherein the pilot signal is a full band signal with a volume smaller than an audible value, and wherein the pilot signal is generated as a driving signal.

21. The method as claimed in claim 15, wherein, further comprising:
providing a playback audio signal, and the playback audio signal is a wide band signal with a volume lower than an audible value; and
receives the playback audio signal to be a detection signal and drives the speaker according to the detection signal.

22. An electronic apparatus, comprising:
a speaker;
an audio signal processor, coupled to the speaker, for sensing a variation of an acoustic condition of the speaker; and an application processor, coupled to the audio signal processor, for:

generating a logic high and low signal in response to the sensed variation of the acoustic condition;

interpreting the logic high and low signal as a control signal;

receiving a plurality of defined patterns, wherein the defined patterns are stored in a storage device, and the defined patterns are set respectively corresponding to a plurality of application programs or a plurality functions of an application program; and performing an instruction corresponding to the control signal by comparing a waveform of the logic high and low signal of the control signal with the defined patterns.

* * * * *